(12) United States Patent
Wada et al.

(10) Patent No.: US 9,840,038 B2
(45) Date of Patent: Dec. 12, 2017

(54) RESIN MOLD

(71) Applicant: Toyo Gosei Co., Ltd., ichikawa-shi, Chiba (JP)

(72) Inventors: Risa Wada, Ichikawa (JP); Takeshi Osaki, Ichikawa (JP)

(73) Assignee: TOYO GOSEI CO., LTD., Ichikawa-Shi, Chiba (JP)

( * ) Notice: Subject to any disclaimer, the term of this patent is extended or adjusted under 35 U.S.C. 154(b) by 728 days.

(21) Appl. No.: 14/251,474

(22) Filed: Apr. 11, 2014

(65) Prior Publication Data
US 2014/0306375 A1    Oct. 16, 2014

Related U.S. Application Data

(60) Provisional application No. 61/810,991, filed on Apr. 11, 2013.

(51) Int. Cl.
| | |
|---|---|
| B29C 59/02 | (2006.01) |
| B29C 33/40 | (2006.01) |
| B29C 33/42 | (2006.01) |
| B41C 1/10 | (2006.01) |
| B41M 1/06 | (2006.01) |
| G03F 7/20 | (2006.01) |
| B29C 43/02 | (2006.01) |
| B29C 43/36 | (2006.01) |
| G03F 7/00 | (2006.01) |
| B29C 35/08 | (2006.01) |

(52) U.S. Cl.
CPC ............ *B29C 59/022* (2013.01); *B29C 33/40* (2013.01); *B29C 33/424* (2013.01); *G03F 7/0002* (2013.01); *B29C 35/0888* (2013.01); *B29C 2035/0827* (2013.01); *B29C 2043/025* (2013.01); *B29C 2043/3634* (2013.01); *B29C 2059/023* (2013.01); *B41C 1/10* (2013.01); *B41M 1/06* (2013.01); *G03F 7/0022* (2013.01); *G03F 7/2002* (2013.01); *G03F 2007/2067* (2013.01)

(58) Field of Classification Search
None
See application file for complete search history.

(56) References Cited

U.S. PATENT DOCUMENTS

| | | | | |
|---|---|---|---|---|
| 8,206,639 | B2 * | 6/2012 | Zhu ....................... | B82Y 10/00 264/219 |
| 2009/0028910 | A1 * | 1/2009 | DeSimone .......... | A61K 9/0097 424/401 |
| 2013/0258467 | A1 * | 10/2013 | Shiraiwa ............... | C09D 5/006 359/483.01 |

OTHER PUBLICATIONS

Rolland et al.; High-Resolution Soft Lithography: Enabling Materials for Nanotechnologies; Angew. Chem. Int. Ed. 2004, 43, 5796-5799.

* cited by examiner

Primary Examiner — Matthew Daniels
Assistant Examiner — Manley L Cummins, IV
(74) Attorney, Agent, or Firm — TraskBritt, P.C.

(57) ABSTRACT

Described is a resinous structure derived from fluorine-containing polymers useful as a mold having excellent dimensional stability.

6 Claims, 3 Drawing Sheets

Series A of experiments: $t_0$ =230 nm (Table 1);
Series B of experiments: $t_0$ =100 nm (Table 2)

RESIN MOLD

CROSS-REFERENCE TO RELATED APPLICATION

This application claims the benefit under 35 U.S.C. §119 (e) of U.S. Provisional Patent Application Ser. No. 61/810,991, filed Apr. 11, 2013, the disclosure of which is hereby incorporated herein in its entirety by this reference.

TECHNICAL FIELD

Several aspects of the disclosure relate to the field of resin molds and related methods of manufacturing components and devices.

BACKGROUND

Resins have excellent characteristics such as resistance to impact, light permeability, and lightweight properties. Thus, resin molds are potentially useful for manufacturing components and devices as resin molds. However, such resin molds have a problem with working lifetime.

Rolland et al. "High-Resolution Soft Lithography: Enabling Materials for Nanotechnologies," *Angew. Chem. Int. Ed.*, 43:5796-5799 (2004), the contents of the entirety of which are incorporated by this reference, describes high capabilities of PFPE-based elastomers in resolution soft lithography. Further work is desired.

BRIEF SUMMARY

Described are resin molds having excellent working lives. Also described are resinous structures derived from fluorine-containing polymers useful as molds with dimensional stability.

Described is a resin that includes a first surface, where a plurality of first portions and a plurality of second portions are formed; and a second surface. In certain embodiments, this resin mold is characterized in: a first distance between a plurality of first portions and a second surface at a first time before 400 times transfer printings are carried out using the resin mold is greater than a second distance the plurality of second portions and the second surface at the first time; a third distance between the plurality of first portions and the second surface at a second time after the 400 times transfer printings are carried out is greater than a fourth distance between the plurality of second portions and the second surface at the second time, a first difference between the first distance and the second distance is different than a second difference between the third distance and the fourth distance, a ratio of a third difference between the first difference and the second difference to the first difference is less than or equal to 12%.

In certain embodiments, the resin mold may be constituted of a first resin, the first resin having a plurality of carbon-fluorine bonds.

With regard to the resin mold, in certain embodiments, the first resin includes a first unit and a second unit; the first unit having a first main chain, the second unit having a second main chain; and a first average content of fluorine atom per one atom included in the first main chain is different than a second average content of fluorine atom per one atom included in the second main chain.

With regard to the resin mold, in certain embodiments, the first resin further includes a third unit; the third unit having a third main chain; a third average content of fluorine atom per one atom included in the third main chain is different than the first average content and the second average content.

In certain embodiments, a resin mold includes: a first surface where a plurality of first portions and a plurality of second portions are formed; and a second surface. In certain embodiments, the resin mold is characterized in: a first distance between the plurality of first portions and the second surface is greater than a second distance the plurality of second portions and the second surface; the resin mold is constituted of a first resin; the first resin includes a first unit and a second unit; the first unit has a first main chain; the second unit has a second main chain; and a first average content of fluorine atom per one atom included in the first main chain is different than a second average content of fluorine atom per one atom included in the second main chain.

With regard to the resin mold, it is preferred that: the first resin further includes a third unit; the third unit has a third main chain; a third average content of fluorine atom per one atom included in the third main chain is different than the first average and the second average.

In certain embodiments, a resin mold includes: a first surface where a plurality of first portions and a plurality of second portions are formed; and a second surface. It is preferred that the resin mold is characterized in: a first distance between the plurality of first portions and the second surface at a first time before 1000 times transfer printings are carried out using the resin mold is greater than a second distance the plurality of second portions and the second surface at the first time; a third distance between the plurality of first portions and the second surface at a second time after the 1000 times transfer printings are carried out is greater than a fourth distance between the plurality of second portions and the second surface at the second time; a first difference between the first distance and the second distance is different than a second difference between the third distance and the fourth distance; and a ratio of a third difference between the first difference and the second difference to the first difference is less than or equal to 26%.

With the resin mold, it is preferred that the resin mold is constituted of a first resin, and a concentration of fluorine atom included in the first resin is greater than or equal to 20 wt %.

In certain embodiments, a resin mold includes: a first surface where a plurality of first portions and a plurality of second portions are formed; and a second surface. It is preferred that the resin mold is characterized in: a first distance between the plurality of first portions and the second surface is greater than a second distance the plurality of second portions and the second surface; the resin mold is constituted of a first resin; and a concentration of fluorine atom included in the first resin is greater than or equal to 20 wt %.

With regard to the resin mold, in certain embodiments, it is preferred that the concentration of fluorine atom is less than or equal to 76 wt %.

With regard to the resin mold, in certain embodiments, it is preferred that the concentration of fluorine atom is greater than or equal to 24.8 wt %.

With regard to the resin mold, in certain embodiments, it is preferred that the concentration of fluorine atom is less than or equal to 32.1 wt %.

With regard to the resin mold, in certain embodiments, it is preferred that: the resin mold is constituted of a first resin; and the first resin includes a first bond between a carbon atom bonded to two fluorine atoms and a first constituent atom other than a carbon atom and a fluorine atom.

With regard to the resin mold, it is preferred that: the first resin includes a second bond between a carbon atom bonded to two fluorine atoms and a carbon atom.

With regard to the resin mold, it is preferred that the first resin includes a carbon atom bonded to a first fluorine atom, a second fluorine atom, a first carbon atom, and a second carbon atom.

With regard to the resin mold, it is preferred that the first carbon atom is bonded to a second constituent atom other than a carbon atom and a fluorine atom.

In certain embodiments, a resin mold includes: a first surface where a plurality of first portions and a plurality of second portions are formed; and a second surface. It is preferred that the resin mold is characterized in: a first distance between the plurality of first portions and the second surface is greater than a second distance the plurality of second portions and the second surface; the resin mold is constituted of a first resin; and the first resin includes a first bond between a carbon atom bonded to two fluorine atoms and a first constituent atom other than a carbon atom and a fluorine atom.

With regard to the resin mold, it is preferred that the first resin includes a second bond between a carbon atom bonded to two fluorine atoms and another carbon atom.

In certain embodiments, a resin mold includes: a first surface where a plurality of first portions and a plurality of second portions are formed; and a second surface. It is preferred that the resin mold is characterized in: a first distance between the plurality of first portions and the second surface at a first time before 50 times transfer printings are carried out using the resin mold is greater than a second distance the plurality of second portions and the second surface at the first time; a third distance between the plurality of first portions and the second surface at a second time after the 50 times transfer printings are carried out is greater than a fourth distance between the plurality of second portions and the second surface at the second time; a first difference between the first distance and the second distance is different than a second difference between the third distance and the fourth distance; and a ratio of a third difference between the first difference and the second difference to the first difference is less than or equal to 10%.

With regard to the resin mold, it is preferred that the concentration of fluorine atom is less than or equal to 37 wt %.

A composition relating to an aspect of the disclosure is used for forming a resin. With regard to the composition, it is preferred that the composition include: a first compound that contains at least one fluorine atom; and a second compound of which a chemical structure formula is different than a chemical structure formula of the first compound; and the first compound has at least one fluorine atom.

With regard to the composition, it is preferred that each of the first compound and the second compound has at least carbon-fluorine bond.

A method for manufacturing a plurality of components relating to an aspect of the disclosure includes: a first step of preparation of the resin according to any one of the above resins; and a second step of repeat of transfer printings by using the resin to manufacture the plurality of components.

A resin mold is disclosed in the disclosure. The resin mold can be applied to manufacturing of a plurality of components such as light guide plate, polarization plate, and lens by repeating transfer printings. The resin mold can be also applied to forming of electronic elements such as transistor and diode.

BRIEF DESCRIPTION OF THE DRAWINGS

In the drawings, which illustrate what is currently considered to be the best mode for carrying out the invention.

DETAILED DESCRIPTION

Figure 1:
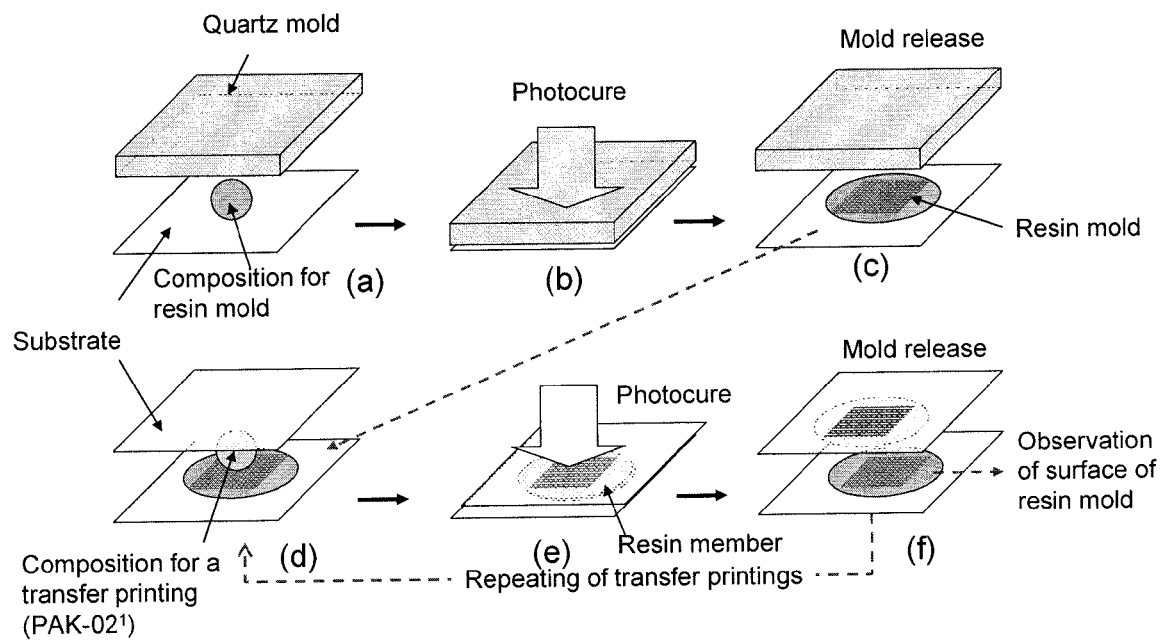
FIG. 1 shows the experimental procedures for observing the surface of a resin mold.

Experimental Procedures:

FIG. 1 shows the experimental procedures for observation of surface of resin mold. The experimental procedure is as follows:

(a) A composition for forming resin mold is disposed on a substrate.

(b) A concavo-convex surface of a quartz mold is pressed to the composition against the substrate. Irradiation of the composition with a light transmitted through the quartz mold forms a resin mold of which the surface has a concavo-convex pattern transferred from the quartz mold.

(c) The resin mold is released from the quartz mold.

(d) The concavo-convex pattern of the resin mold is pressed to a composition for transfer printing disposed on a substrate against the substrate.

(e) An irradiation of the composition for transfer printing with a light transmitted through the quartz mold forms a resin member of which surface has a concavo-convex pattern transferred from the resin mold.

(f) The resin member is released from the resin mold and the surface having the concave-convex pattern of the resin mold is observed. Therefore, at least one of the resin mold and the resin member requires mold release capability.

For a resin mold to be used for nanoimprinting, it is desired that there be little deterioration of the concavo-convex pattern of the resin mold by repeated transfer printings. Such a repeating process can be applied to component fabrication of components such as optical components, electronic components, and other devices due to the long working lifetime of the resin mold hereof.

Figure 2:
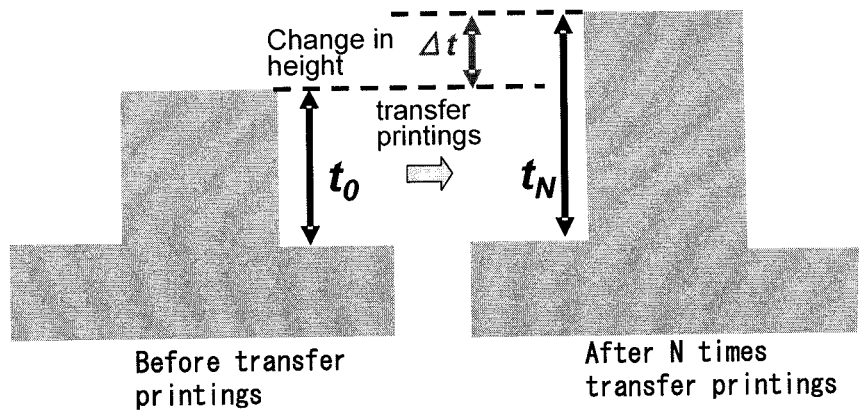
FIG. 2 illustrates the change in height ($\Delta t$) of the resin mold.

FIG. 2 shows an explanation for change in height ($\Delta t$) of resin mold. $t_0$ and $t_N$ are the difference between the bottom and the top of the concavo-convex pattern in a cross-section view before performing transfer printings and that after performing transfer printings, respectively. $\Delta t$ is a reflection of the degree of the deterioration and increases with the progression of the deterioration.

A resin mold for which a small $\Delta t$ is observed is a superior one useful, e.g., for nanoimprinting. The major reason for the increase of $\Delta t$ is considered to be that the resin mold swells by penetration of components or a solvent included in composition for transfer printing during transfer printings. Therefore, materials suppressing penetration of such components should be used for resin molds. More concretely, liquid repellent capability and/or high crosslink density are required for the materials used for resin molds.

The invention is further described with the aid of the following illustrative Examples.

EXAMPLES

Series A of Experiments

Table 1 shows compositions of resin molds and changes in height of the resin molds. The compositions presented in Table 1 include the constituent A1 (average molecular weight: ca 1850; p: 8.7 (average); q: 5.1 (average)) and initiator I. In addition to the constituent A1 and initiator I, the constituent A2 (average molecular weight: ca 1000; n: 1.5 (average)) and/or constituent B are added to the compositions. Since the constituent A2 has fluorine atoms and a higher ratio of the number of polymerizable substituents to the molecular weight higher than that of the constituent A1, the constituent A2 is considered to make greater contribution to crosslink density than the constituent A1 while contributing to liquid repellent capability. Since the ratio of the number of polymerizable substituents to the molecular weight in the constituent B is greatest among the constituents A1, A2, and B, the constituent B is considered to make greatest contribution to crosslink density. Entries 2-6 are desirable compositions for forming resin molds used for nanoimprinting since dimension errors ($\Delta t/t_0$) % for 400 times transfer printings of the resin molds formed by the compositions of the entries 2-6 are equal to smaller than 12%.

The dimension error is desirable to be within 12% when 400 times of transfer printings are carried out.

The resin formed from composition of Entry 1 shows a change in height after 500 transfer printings, 800 transfer printings, and 1000 transfer printings of less than 60 nm. Thus, the dimension errors are within 26% when 500 times, 800 times and 1000 time of transfer printings are carried out.

The resin formed from composition of Entry 5 shows a change in height after 500 transfer printings, 800 transfer printings, and 1000 transfer printings of less than 10 nm. Thus, the dimension errors are within 10% when 500 times, 800 times and 1000 time of transfer printings are carried out.

Series B of Experiments

Table 2 shows compositions of resins and changes in height of the resin molds. The compositions presented by Table 2 include constituents A1 (average molecular weight: ca 1850; p: 8.7 (average); q: 5.1 (average)), B, and initiator I. Since the ratio of the number of polymerizable substituents to the molecular weight in the constituent B is greater than the constituent A1, the constituent B is considered to make greatest contribution to crosslink density. Entries 2-4 are desirable compositions for forming resin molds used for nanoimprinting since dimension errors ($\Delta t/t_0$) % for 50 times transfer printings of the resin molds formed by the compositions of the entries are less than or equal to 10%.

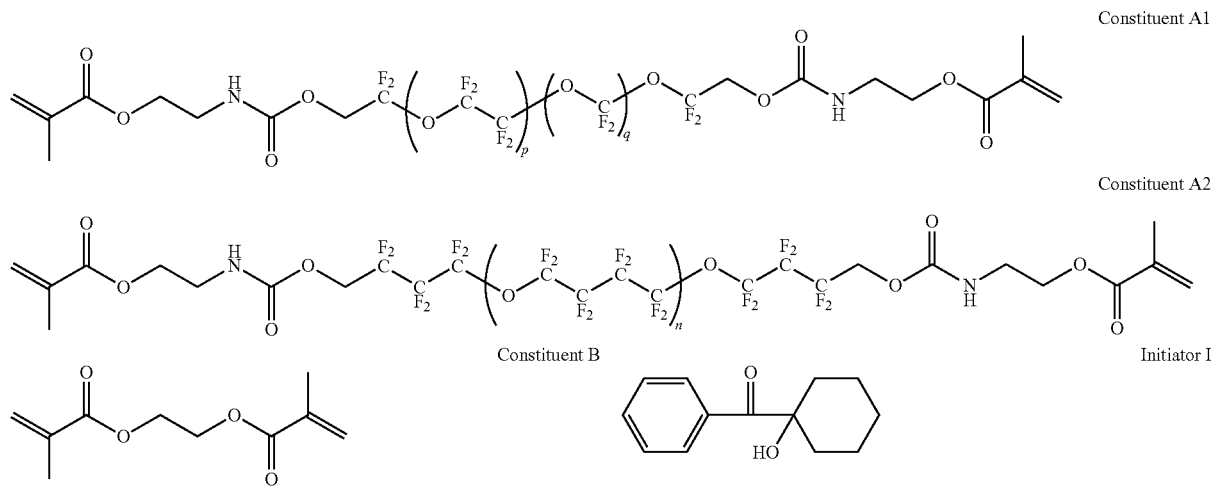

TABLE 1

Compositions of resins and changes in height of the resin mold (Series A)

| Composition for mold resin | Entry 1 | Entry 2 | Entry 3 | Entry 4 | Entry 5 | Entry 6 |
|---|---|---|---|---|---|---|
| Constituent A1 | 76 | 66 | 46 | 36 | 26 | 51 |
| Constituent A2 |  |  | 20 | 30 | 40 |  |
| Constituent B | 20 | 30 | 30 | 30 | 30 | 45 |
| Initiator I | 10 | 10 | 10 | 10 | 10 | 10 |
| the estimated concentration of fluorine in the resin/% by weight | 36.9% | 32.1% | 31.0% | 30.4% | 29.9% | 24.8% |
| $\Delta t$/nm (Change in height after 400 times transfer printings) | 57 | 27 | 18 | 19 | 10 | 17 |
| Dimension error ($\Delta t/t_0$) % | 25 | 12 | 8 | 8 | 4 | 8 |

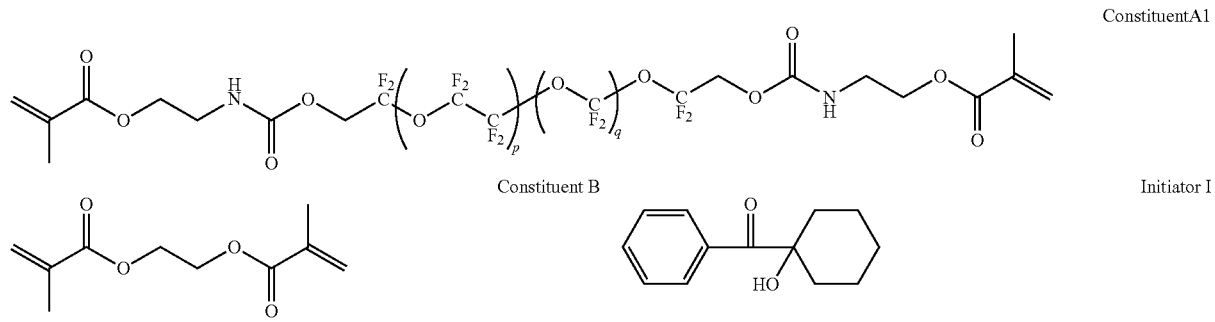

Constituent A1

Constituent B

Initiator I

TABLE 2

Compositions of resins and changes in height of the resins (Series B)

| Composition for mold resin | Entry 1 | Entry 2 | Entry 3 | Entry 4 |
|---|---|---|---|---|
| Constituent A1 | 91 | 76 | 71 | 66 |
| Constituent B | 5 | 20 | 25 | 30 |
| Initiator I | 10 | 10 | 10 | 10 |
| the estimated concentration of fluorine in the resin/% by weight | 44.2% | 36.9% | 34.5% | 32.1% |
| Δt/nm (Change in height after 50 times transfer printings) | +50 nm | +10 nm | +5 nm | +5 nm |
| Dimension error (Δt/t$_0$)/% | 50 | 10 | 5 | 5 |

The dimension error is desirable to be within 10% when 50 times of transfer printings are carried out.

Initiators:

Instead of the Initiator I, for example, acetophenone-based initiators, alkylphenone-based initiators, benzoin-based initiators, benzyl ketal-based initiators, anthraquinone-based initiators, acyloxime-based initiators, and acyl phosphine oxide-based initiators can be used for curing the precursors (constituents A1, A2, and B).

Figure 3:
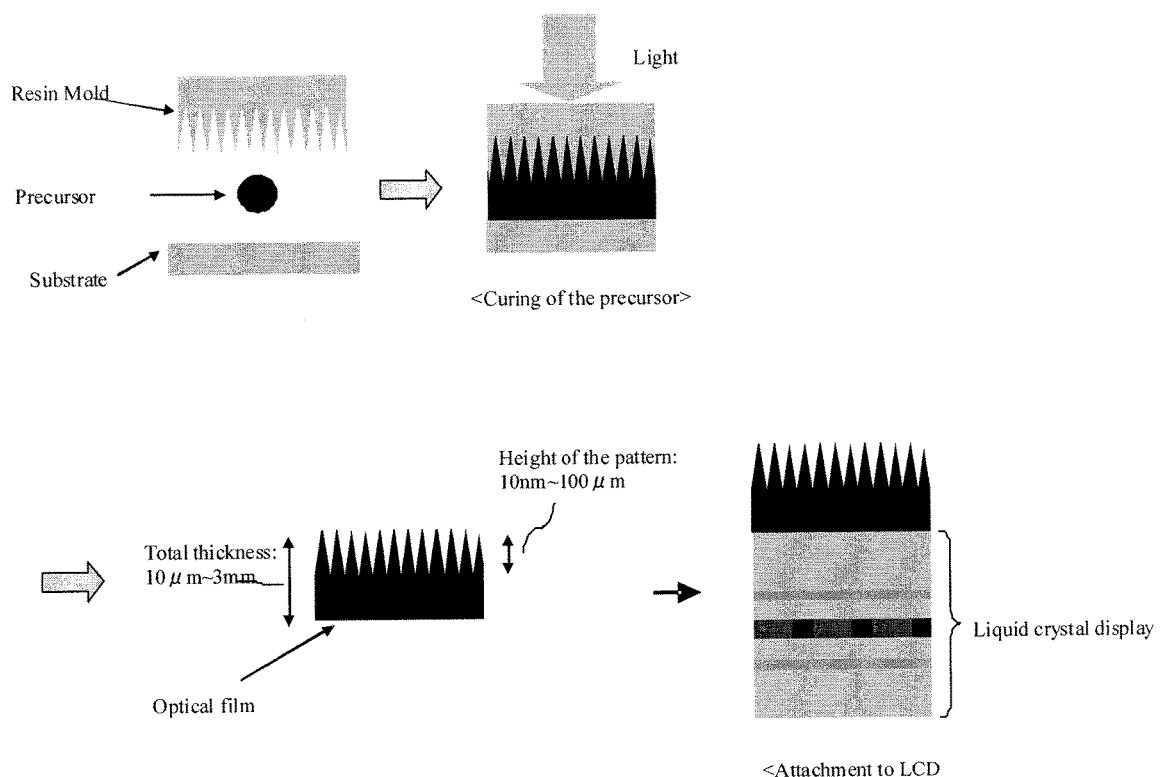
FIG. 3 shows the manufacturing process of optical film (such as antireflection film) using a resin mold hereof.

FIG. 3 shows the manufacturing process of an optical film (such as an antireflection film) using the resin mold formed from one of the compositions disclosed herein.

A resin mold and a substrate are prepared. The precursor for film is disposed between the resin mold and the substrate. An optical film is formed by irradiation of the precursor with a light transmitted through the resin mold. After the optical film is released from the resin mold and substrate, the optical film is attached to a liquid crystal display (LCD). The optical film can be used as an optical film for other electro-optical devices such as an electroluminescence device and/or electrophoretic device.

Such resin mold can be used in repeating fashion for components or devices such as optical components and electronic devices due to the long working lifetime of the resin mold hereof.

What is claimed is:

1. A resin mold comprising:
   a first surface where a plurality of first portions and a plurality of second portions are formed; and
   a second surface,
   wherein the resin mold is constituted of a first resin having a plurality of carbon-fluorine bonds, wherein the first resin is formed of a composition including a polymerizable constituent A1 having a unit represented by the following formula (a1) and a polymerizable constituent A2 having a unit represented by the

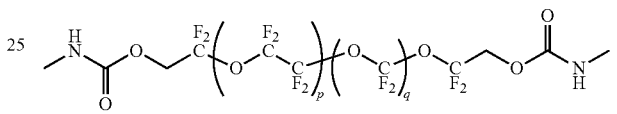

(a1)

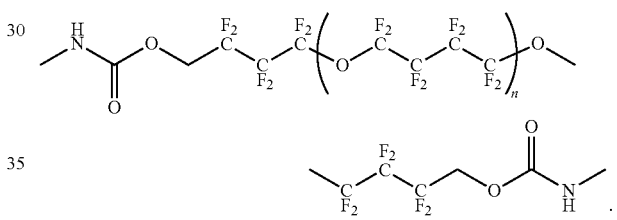

(a2)

2. The resin mold of claim 1, wherein a concentration of fluorine atom included in the first resin is greater than or equal to 20 wt %.

3. The resin mold of claim 1, wherein a concentration of fluorine atom in the first resin is less than or equal to 76 wt %.

4. The resin mold of claim 3, wherein the concentration of fluorine atom is greater than or equal to 24.8 wt %.

5. The resin mold of claim 1, wherein a concentration of fluorine atom in the first resin is less than or equal to 32.1 wt %.

6. A method of using the resin mold of claim 1 to manufacture a plurality of components having a concavo-convex pattern, the method comprising:
   providing the resin mold with a concavo-convex surface; and
   repeating transfer printings from the resin mold to manufacture the plurality of components having a concavo-convex pattern.

* * * * *